United States Patent [19]

Preedy

[11] 4,420,820
[45] Dec. 13, 1983

[54] PROGRAMMABLE READ-ONLY MEMORY

[75] Inventor: David R. Preedy, Colorado Springs, Colo.

[73] Assignee: Signetics Corporation, Sunnyvale, Calif.

[21] Appl. No.: 479,344

[22] Filed: Mar. 30, 1983

Related U.S. Application Data

[63] Continuation of Ser. No. 220,459, Dec. 29, 1980, abandoned.

[51] Int. Cl.³ .................................................. G11C 11/36
[52] U.S. Cl. ........................................ 365/105; 365/175
[58] Field of Search .................. 365/96, 94, 103, 104, 365/105, 175; 307/238.3; 357/45, 47, 48

[56] References Cited

U.S. PATENT DOCUMENTS 3,641,516  2/1972  Castrucci et al. ............... 365/105 X
3,733,690  5/1973  Rizzi et al. .
3,742,592  7/1973  Rizzi et al. .
3,848,238  11/1974 Rizzi et al. .
4,208,727  6/1980  Redwine et al. .................... 365/105

FOREIGN PATENT DOCUMENTS 2005078  4/1979  United Kingdom .
2005079  4/1979  United Kingdom .

Primary Examiner—Robert L. Richardson
Attorney, Agent, or Firm—Jerry A. Dinardo; Ronald J. Meetin; Thomas A. Briody

[57] ABSTRACT

A semiconductor memory cell for a programmable read-only memory includes a polysilicon layer formed with laterally spaced surface regions which differ in impurity concentration and which form two back-to-back series diodes functioning as a programmable diode and an isolating diode. Because of the different impurity concentration, the diodes have different reverse-bias breakdown voltages. The programmable diode has the lower reverse-bias breakdown voltage. The high reverse-bias breakdown voltage of the isolating diode has the effect of blocking the parasitic current drain on the programming current.

17 Claims, 20 Drawing Figures

PROGRAMMABLE READ-ONLY MEMORY

This is a continuation of U.S. patent application Ser. No. 220,459, filed Dec. 29, 1980, now abandoned.

BACKGROUND OF THE INVENTION

This invention relates to programmable read-only memories and in particular to an improved memory cell for an electrically programmable read-only memory.

One type of memory cell for an electrically programmable read-only memory is disclosed in United Kingdom patent application GB No. 2,005,078A published Apr. 11, 1979. In that publication a memory cell is disclosed which comprises a layer of polysilicon mounted on an insulating layer which is provided on a surface of a semiconductor substrate, the polysilicon layer having three laterally spaced semiconductor regions which form two back-to-back diodes with two spaced apart PN junctions. One of the diodes serves as a programmable diode having a destructible junction, while the other diode is intended to have its junction remain intact and serves as an isolating diode.

To program the cell, a voltage of such polarity is applied across the two series diodes as to cause current flow in the reverse direction through the programmable diode and in the forward direction through the isolating diode. The voltage has to be of sufficient magnitude to destroy, by short circuiting, the junction of the programmable diode. To reduce the programming voltage and current to levels which can be safely carried elsewhere in the memory matrix, the destructible junction is formed with a constriction to reduce its junction area.

Nevertheless, the current levels required to short circuit the junction of the programmable diode are substantial, and there exists a need to reduce the programming voltage and current still further. Moreover, it is necessary to reduce the parasitic currents through already programmed cells in the matrix which lie in paths shunting the cells yet to be programmed. The parasitic current drains impose a requirement for higher than usual programming voltage which could destroy the junction of an isolating diode in an already programmed cell.

In a companion UK patent application, GB No. 2,005,079A published Apr. 11, 1979, there is disclosed a similar memory cell in which the programmable diode is formed in a thin surface layer of polysilicon and the isolating diode comprises a planar PN junction formed between two superimposed semiconductor regions. In one embodiment the superimposed regions of the blocking diode may comprise the emitter and base regions of a bipolar transistor.

Other types of electrically programmable memory cells the read-only memories are disclosed in the following references:
British Pat. No. 1,448,482
U.S. Pat. No. 3,733,690
U.S. Pat. No. 3,742,592
U.S. Pat. No. 3,848,238

SUMMARY OF THE INVENTION

A semiconductor programmable memory cell according to the invention comprises a layer of polysilicon supported by a semiconductor substrate and separated from a surface of the substrate by an insulating layer. Typically the substrate is mono-crystalline silicon and the insulating layer is silicon dioxide.

The polysilicon layer is formed with a plurality of laterally spaced surface regions which differ in impurity concentration and which form two back-to-back series diodes. The different impurity concentrations endow the two diodes with different reverse-bias breakdown voltages. The diode having the lower reverse-bias breakdown voltage becomes the programmable diode and the diode with the higher reverse-bias breakdown voltage becomes the isolating diode. The high reverse-bias breakdown voltage of the isolating diode has the effect of blocking the parasitic current drain on the programming current.

DESCRIPTION OF THE PREFERRED EMBODIMENT

Figure 1:
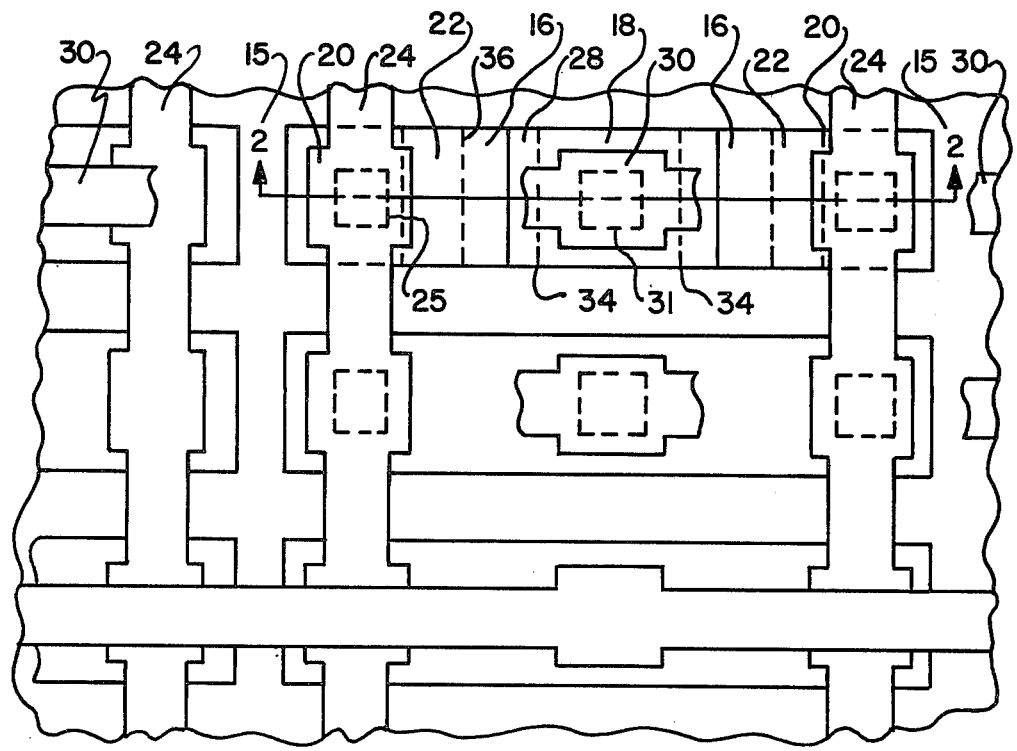
FIG. 1 is a greatly enlarged top plan view of a portion of a PROM showing several memory cells according to an embodiment of the invention.
Figure 2:
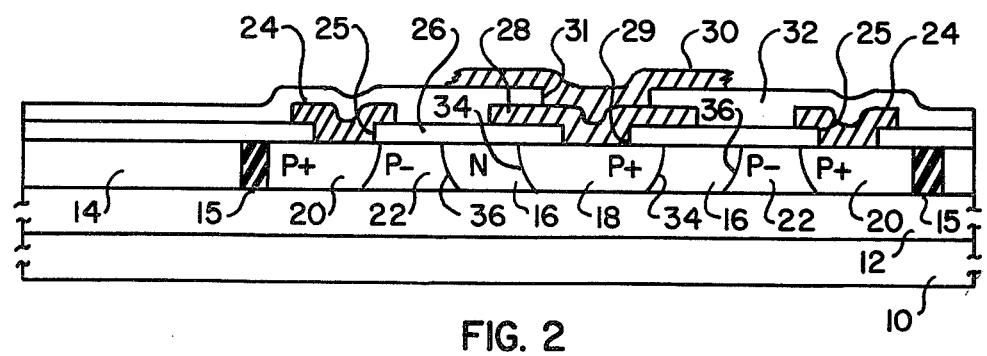
FIG. 2 is a cross-sectional view taken along line 2—2 of FIG. 1.

FIG. 1 is a greatly enlarged top plan view of a partial array of memory cells according to the invention, and FIG. 2 is a cross-sectional view thereof. A substrate 10 of mono-crystalline semiconductor material, such as silicon, is provided for supporting the memory cell array. The silicon substrate 10 may support or include other circuit elements, not shown, which operate in conjunction with the memory cell array. A thermally and electrically insulating layer 12 is provided on a surface of the substrate 10. The insulating layer 12 may be a thermally grown silicon dioxide layer.

A thin layer 14 of polycrystalline silicon is formed on the insulating layer 12. The polysilicon layer 14 is relatively thin as compared with both the insulating layer 12 and the substrate 10. Typically, the polysilicon layer 14 may be about 4000 angstroms and the insulating layer may be three times or greater in thickness. In FIG. 2, two memory cells are shown, and these cells may be isolated from other groups of cells by oxide isolation regions 15 formed in the polysilicon layer 14 by local oxidation.

The polysilicon layer 14 as originally constituted may be of lightly doped first type conductivity P−. A central portion of the layer 14 has a moderately doped second type conductivity N region 16. Three heavily doped regions 20, 18, 20 of first type conductivity P+ complete the dual cell structure. One of these heavily doped regions 18 of first type conductivity is formed within the moderately doped second type conductivity N region 16 and the other two heavily doped regions 20 of first type conductivity P+ are spaced laterally from the central N type region 16 of second type conductivity on both sides thereof and separated therefrom by lightly doped first type conductivity P— portions 22 of the polysilicon layer 14.

First level metal conductors 24 contact the P+ regions 20 through openings 25 in a first insulating layer 26 provided on the top surface of the polysilicon layer 14. Similarly, a first level metal conductor 28 contacts the P+ region 18 through an opening 29. A second level metal conductor 30 contacts the metal conductor 28 which is in contact with the P+ region 18. The contact between conductors 30 and 28 is made through an opening 31 in a second-insulating layer 32 which also serves to insulate conductors 24 from the conductor 30. Several second level metal conductors 30 are shown in FIG. 1 as vertical column conductors and the first level metal conductors 24 are shown as horizontal row conductors.

According to a specific embodiment, the P+ heavily doped regions 18 and 20 may have an impurity concentration of $1 \times 10^{20}$ boron atoms/cc. The moderately doped N regions 16 may have an impurity concentration of $1 \times 10^{19}$ phosphorus atoms/cc. The lightly doped p— region may have an impurity concentration of $1 \times 10^{18}$ boron atoms/cc.

The adjacent regions 16 and 18 form a semiconductor PN junction 34 and the adjacent regions 16 and 22 form a semiconductor PN junction 36. The P+ regions 20 form low resistance electrical contacts with the metal conductors 24, which preferably are made of aluminum. The P+ region 18 forms low resistance electrical contact with the metal conductor 28, also made of aluminum. However, unlike the P+ regions 20, the P+ region 18 also serves as a positive side or anode of a semiconductor diode whose negative side or cathode is the N+ region 16, which forms the semiconductor junction 34 with the P+ region 18.

Reading from left to right in FIG. 2, one-half of the dual cell structure comprises a row conductor and metal contact 24, forming a low resistance contact to the P+ contact region 20, a P— region 22 in contact with the P+ contact region 20 and serving as one side of an isolating diode, an N region 16 forming a first semiconductor junction 36 with the P— region 22 and serving as the other side of the isolating diode and also as one side of a programmable or destructible diode, a P+ region 18 forming a second semiconductor junction 34 with the N region 16 and serving as the other side of the destructible diode, a metal contact 28 forming a low resistance contact to the P+ region 18, and a column conductor 30 in contact with the metal contact 28. The PNP structure formed by the regions 22, 16, 18 comprise two back-to-back diodes.

The right half of the dual cell structure is a mirror image of the left half and comprises another set of back-to-back diodes.

An important feature of the invention is that the three regions 22, 16, and 18 forming the back-to-back diodes have mutually different doping concentrations. The junction 36 between the lightly doped P— region 22 and the N region 16 of intermediate doping concentration has a higher reverse-bias breakdown voltage $V_B$ than the junction 34 between the intermediately doped N region 16 and the heavily doped P+ region 18. The reverse-bias breakdown voltage $V_B$ of a semiconductor junction is directly proportional to the resistivity of the high resistivity side of the junction. The breakdown voltage $V_B$ of the first junction 36 is proportional to the resistivity of the high resistivity, lightly doped P— region 22, and the breakdown voltage $V_B$ of the second junction 34 is proportional to the resistivity of the moderately doped N region 16, which is less heavily doped than the low resistivity P+ region 18. Of the two regions 16 and 22 that are determinative of their respective breakdown voltages, the moderately doped N region 16 has a lower resistivity than the lightly doped P— region 22 and therefore the junction 34 has a lower reverse-bias breakdown voltage than the junction 36. The junction 34 having the lesser reverse-bias breakdown voltage $V_B$ serves as the destructible junction when a voltage source is applied across the conductors 24 and 30 with a negative polarity to the column conductor 30 and a positive polarity to the row conductor 24. The low reverse-bias breakdown voltage of the second junction 34 permits that junction to break down with a relatively low programming voltage applied across the two diodes in series. However, the relatively high reverse-bias breakdown voltage of the first junction 36 enables that junction to withstand the same voltage applied to it in the reverse direction and thereby block the current in any parasitic path. As a result, there is a reduction in the parasitic currents that drain away the programming current, and it is thereby possible to reduce the level of programming current and voltage that needs to be supplied.

Although the mechanism of destroying the second semiconductor junction 34 between the two regions 16 and 18 of the polysilicon layer 14 is not fully understood, it is believed to start with avalanche breakdown of the junction by high minority carrier current flow across the junction in the reverse direction, with attendant heating of the junction. Heat from the junction is conducted to the interface between the metal conductor 28 and the semiconductor surface of the P+ region 18, thereupon causing heating of the aluminum metal in that interface region and migration of the thermally activated aluminum atoms to the semiconductor junction 34 where they cause the junction to permanently short circuit.

According to the above theory, a low melting point metal such as aluminum is preferred for the metal conductor 28 to provide a copious supply of metal atoms at a reasonably low temperature. In addition, the insulation layer 12 which supports the polysilicon layer 14 should be thick enough and made of such good thermal insulation material as to thermally insulate the polysilicon layer 14 from the heat sinking effect of the semiconductor substrate 10. Otherwise, the thermal effects required at the destructible junction 34 would be impaired. Also, the polycrystalline nature of the polysilicon layer 14, having voids in the crystalline lattice, aids in conducting the metal atoms to the junction 34. The lateral extent of the metal conductor 28 in contact with the P+ region 18 should provide an overlap of the destructible junction 34. The overlap is secured in order to expose as large an area as possible of the aluminum conductor 28 to the heated junction 34, for heat transfer through the insulating layer 26. For optimum transfer of heat from the junction 34 to the overlapping metal conductor 28, the insulating layer 26 should be as thin as possible while at the same time providing good electrical insulating properties.

It is noted that both of the semiconductor junctions 34 and 36 are lateral junctions as distinguished from planar junctions. A lateral junction is one in which current flows across the junction mainly in a direction parallel to the semiconductor major surface, rather than mainly transverse to the major surface as occurs in a planar junction. All of the semiconductor regions 20, 22, 16 and 18 are spaced laterally from each other, with no one of the regions intercepting another region in the vertical or transverse sense. The junction areas are thereby minimized to facilitate destruction of the programmable diode or junction. More importantly, however, the reproducibility of the cells having the same high reverse-bias breakdown voltage for the isolation diode and the same low reverse-bias breakdown voltage for the programmable diode is more readily attainable in a lateral structure than in a planar structure, where the doping gradients in the vicinity of the junction are more pronounced and less controllable due to the larger and more irregular junction area.

FIGS. 3–8 illustrate various processing steps for another embodiment of the invention. A silicon substrate 10 is provided with a silicon dioxide layer 12 of sufficient thickness to provide good thermal as well as electrical insulating properties. The silicon dioxide layer 12 may be thermally grown according to well known practice.

A layer 38 of intrinsic polysilicon is deposited on the oxide layer 12 and is thereafter subjected to N type impurity dopant, such as phosphorus, to give it a relatively light doping concentration. During drive-in diffusion of the phosphorus impurity atoms, a thin thermal oxide layer 40 is grown on the surface of the polysilicon layer 38.

Following the growing of the thin oxide layer 40, another impurity dopant, this time a light P-type doping such as boron, may be implanted through the thin oxide layer 40 into the polysilicon layer 38. The light P-type blanket doping is for the purpose of stabilizing the polysilicon layer and does not materially reduce the previous doping concentration, which is still lightly doped N-type.

Figure 3:
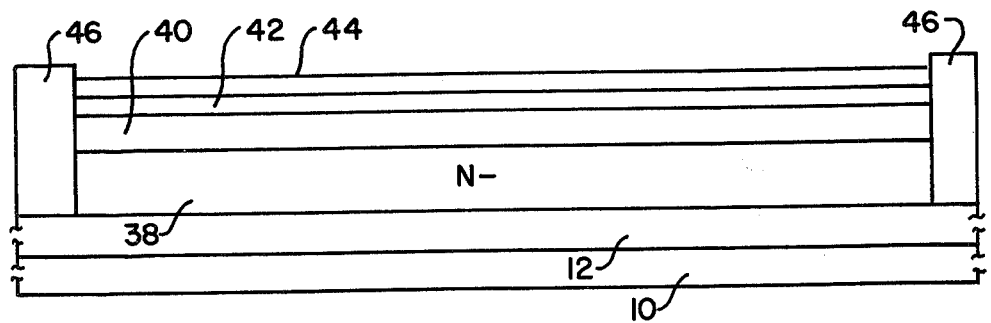
FIGS. 3–8 are cross-sectional views showing various processing steps for fabricating a memory cell constructed according to another embodiment of the invention.

A layer 42 of silicon nitride is deposited on the thin oxide layer 40 and then another thin silicon dioxide layer 44 is deposited on the silicon nitride layer 42. By selective masking and removal steps, the polysilicon layer 38 is locally oxidized in selecting regions to define the boundaries of the memory cell. These regions are shown in FIG. 3 as oxide isolation regions 46.

Figure 4:
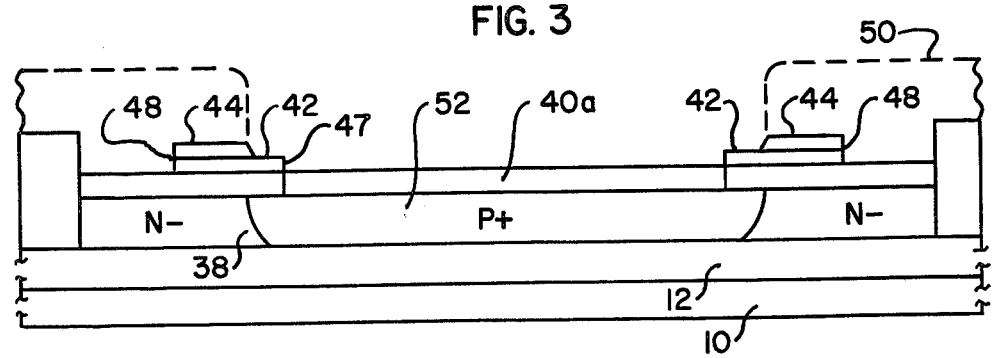

FIG. 4 shows the selective removal of portions of the thin oxide layer 44 and silicon nitride layer 42 to define a large central opening 47 and two other spaced smaller openings 48, one on each side of the central opening 47. A photoresist mask 50, shown in dashed lines to indicate subsequent removal, is provided over the two spaced small openings 48 leaving the central opening 47 unmasked for removal of the oxide layer 40. A heavy doping of boron or other P-type impurity is introduced through the central opening 47, as by implanting or diffusion and the impurities are driven through the entire depth of the polysilicon layer 38 to form a P+ region 52. During the drive-in diffusion, an oxide layer 40a is regrown over the P+ region 52 to replace the thermal oxide layer 40 which was previously removed from that region.

Figure 5:
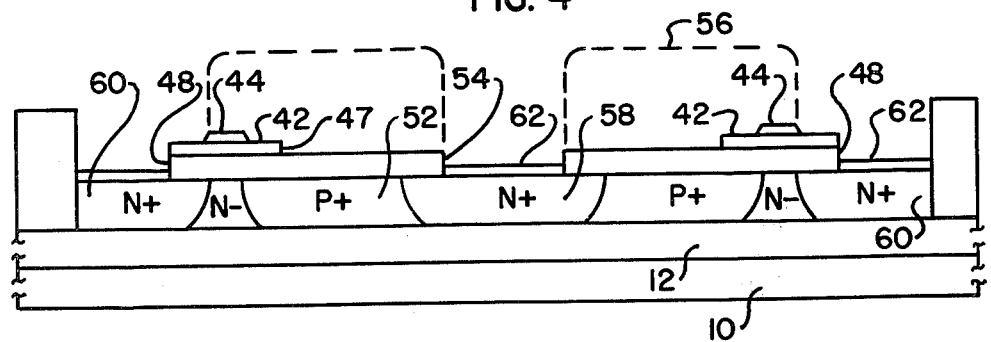

In FIG. 5 another photoresist layer 56 is applied everywhere except over the openings 48 and a small central opening 54 within the larger central opening 47. The thermal oxide layer 40a is removed from a small central region and the original thermal oxide layer 40 is also removed from the spaced openings 48. After the resist is removed, a heavy doping of N-type impurity, such as phosphorus, is then applied through the openings 48 and 54. The N-type doping is driven through the entire depth of the polysilicon layer 38 to produce an N+ region 58 within the P+ region 52 and two N+ regions 60 spaced from the P+ region 52 on either side thereof. During the drive-in diffusion a new thin thermal oxide layer 62 grows over the exposed N+ regions 58 and 60.

Figure 6:
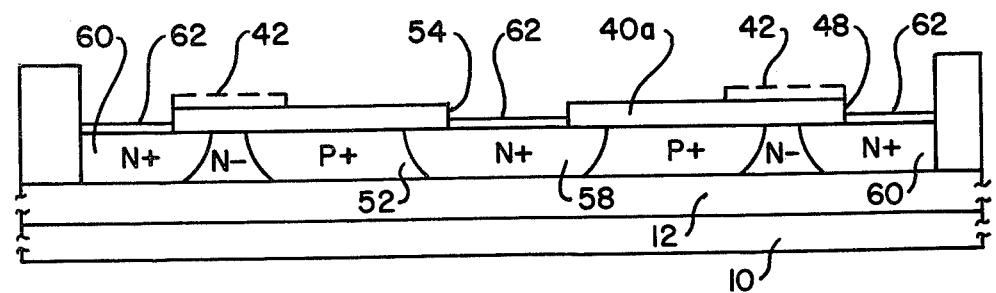

In FIG. 6, the silicon nitride layer 42 is shown removed after removing the thin oxide layer 44 above it.

Figure 7:
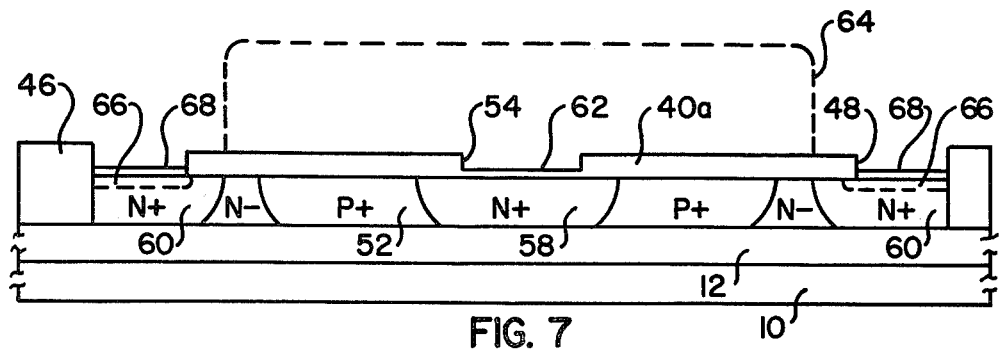

In FIG. 7, a photoresist mask 64 is applied to cover the oxide over the central N+ region 58, after which the oxide layer 62 over the N+ regions 60 is washed away. After the photoresist mask 64 is removed, a metal alloy of platinum and nickel may be deposited on the two spaced N+ regions 60 to form an alloy layer 66 of low ohmic quality. Such an alloy may consist of 40% nickel and 60% platinum. The metal alloy forms an alloy of platinum, nickel and silicon more commonly referred to as platinel silicide, which is shown in FIG. 7 as the dashed line portion extending into the N+ region 60. The metal alloy is prevented from depositing in any other region by the oxide layers 40a and 62 covering those regions. After the alloy layer 66 is formed, a silicon dioxide layer 68 is regrown on the alloy layer 66.

Figure 8:
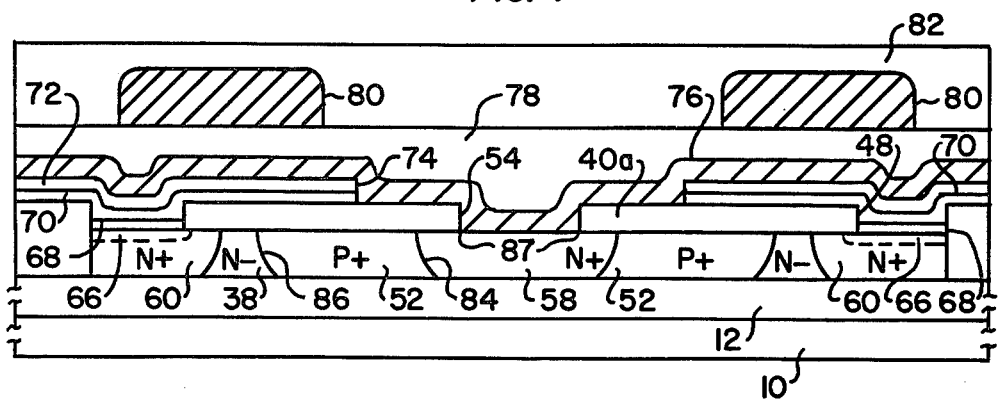

In FIG. 8, a silicon nitride layer 70 is deposited over the entire structure, followed by another silicon dioxide layer 72. The lowermost oxide layer 68 is needed to provide good adherence for the silicon nitride layer 70. The nitride layer 70 and the uppermost silicon dioxide layer 72 are then patterned to form a rather wide opening 74 over the central N+ region 58, the opening 74 terminating about midway between the lateral extremities of the central N+ region 58 and P+ region 52.

The thin oxide layer 62 shown in FIG. 7 is removed from the surface of the N+ region 58 so that the original opening 54 in the thicker oxide layer 40a extends to the N+ region 58. A first layer 76 of aluminum is deposited over the structure to make contact to the central N+ region 58 through the opening 54 in the oxide layer 40a. The first aluminum layer 76 is insulated from the N+ regions 60 by the oxide layers 68, 72 and nitride layer 70. When patterned, the aluminum layer 76 may serve as the row conductors.

The first aluminum layer 76 is covered with an insulating glass layer 78. Openings are provided in the insulating glass layer 78 over the silicided N+ regions 60, the openings also extending through the oxide layers 68, 72 and nitride layer 70. These openings are not shown in FIG. 8 but may be visualized as being located at some distance displaced from the plane of the drawing in line with the openings 48 over the N+ region 60. A second layer 80 of aluminum is deposited over the insulating layer 78 running parallel with the silicided N+ regions 60 and extending through the openings in the insulating glass layer 78, the openings in the oxide layers 68, 72 and the opening in the nitride layer 70, and contacting the alloy layer 66. The second aluminum layer 80 is covered with a top insulating glass coating 82.

In the completed structure shown in FIG. 8, the central N+ region 58 forms a semiconductor junction 84 with the P+ region 52, and the N− region 38 forms a semiconductor junction 86 with the P+ region 52. The junction 84 has a lower reverse-bias breakdown voltage $V_B$ than the junction 86. Thus, the junction 84 serves as the destructible junction, and junction 86 serves as the isolating junction. The N+ regions 60 serve to make low ohmic contact between the N− region 38 and the alloy layer 66. Typically, the N+ region may have an impurity concentration of $10^{20}$ atoms/cm$^3$, the P+ region 52 may have $10^{19}$ atoms/cm$^3$, and the N− region may have $10^{18}$ atoms/cm$^3$.

It will be noted that an oversized opening 74 has been made in the silicon nitride layer 70 and oxide layer 72, with the opening 74 lying about midway between the lateral extremities of the two junctions 84 and 86. This is done to expose to the destructible junction 84 the largest possible area of the aluminum layer 76 separated only by the oxide layer 40a. Thus when the junction 84 breaks down, the heat generated at that junction is more readily transmitted through the oxide layer 40a above and to a larger area of the aluminum layer 76. The heat in the aluminum layer 76 in turn is readily transmitted to the corner regions 87 of the aluminum layer 76 where it contacts both the oxide layer 40a and the N+ region 58. The corner regions 87 of the aluminum layer 76 lie closest to the junction 84 and are the source for the aluminum migration to the junction 84.

The same opening 54 in the oxide layer 40a is used to form the N+ region 58 and to make the aluminum contact to the N+ region 58. This technique is analogous to the washed emitter process in bipolar transistor technology. In this way, the distance between the aluminum contact region 87 and the destructible junction 84 can be said to be self aligning and thus controlled within closer tolerances.

Thus reading from left to right in FIG. 8, one pair of back-to-back diodes is formed between one N+ region 60 and the central N+ region 58, and a second pair of back-to-back diodes is formed between the central N+ region 58 and the other N+ region 60. The N+ region 58 is common to both cells on either side of it, each cell comprising two back-to-back diodes with different reverse-bias breakdown voltage.

FIGS. 9–14 show another embodiment of the invention. For simplicity, like numerals are used to denote elements similar to those shown in the previous embodiment of FIGS. 3–8. In addition, the different photoresist masks are simply labeled such without numerals. A lesser detailed description is given, since it will be apparent from the drawing illustrations and the previous description how the different process steps are carried out.

Figure 9:
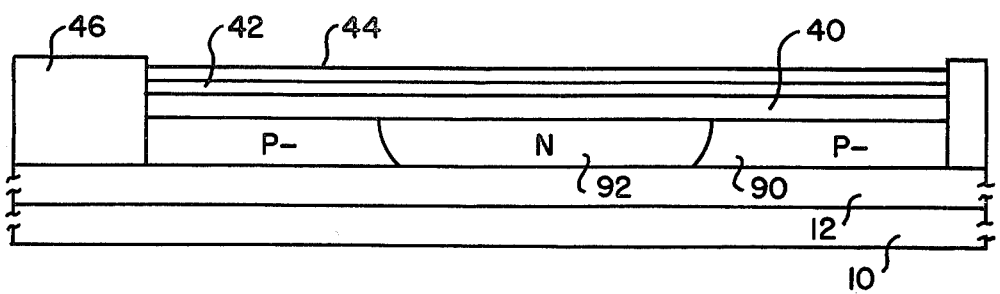
FIGS. 9–14 are cross-sectional views showing various processing steps for fabricating a memory cell constructed according to still another embodiment of the invention.

In FIG. 9, a layer 90 of originally intrinsic polysilicon is provided with a centrally located lightly doped N-type region 92. The entire layer 90 is then provided with a very light P-type doping so that the bulk of the layer 90 is more lightly doped P-type than the central region is doped N-type.

Figure 10:
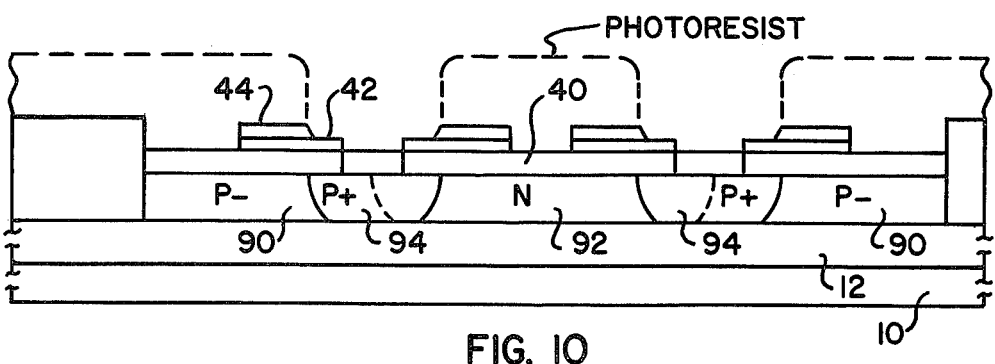

In FIG. 10 two spaced apart highly doped P-type regions 94 are formed which overlap partly the P-region 90 and partly the N region 92.

Figure 11:
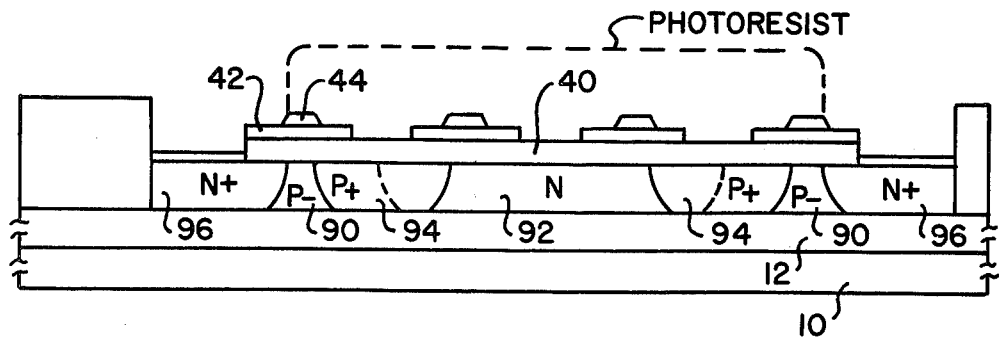

In FIG. 11 two highly doped N+ regions 96 are provided in the P-region 90, each spaced from the P+ regions 94.

Figure 12:
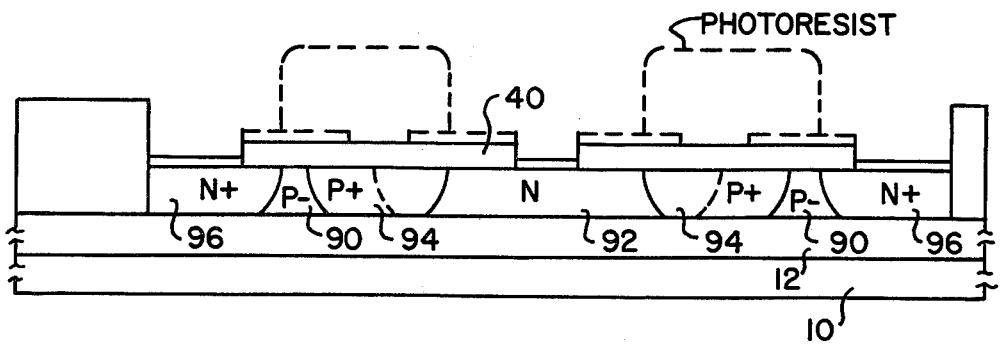

In FIG. 12 a contact opening in the insulating layer 40 is provided over the central N region 92.

Figure 13:
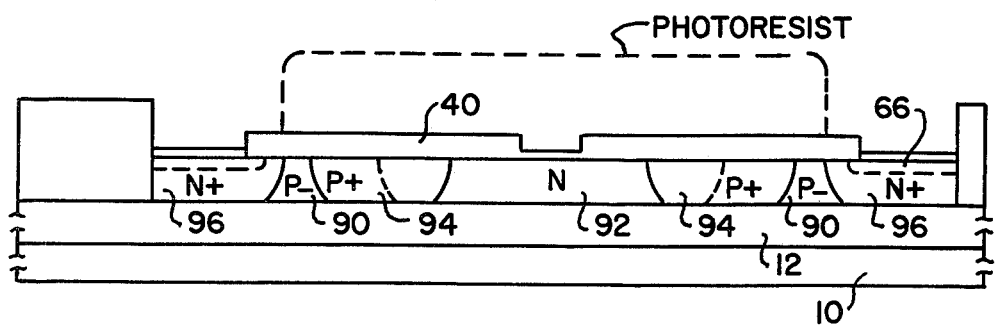

In FIG. 13 the alloy contact regions 66 are provided on the surface of the N+ regions 96.

Figure 14:
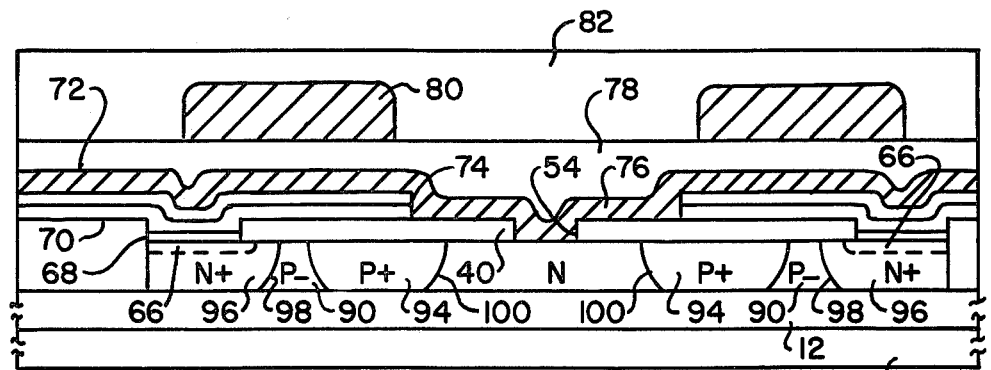

FIG. 14 shows the completed structure. Each N+ region 96 forms a junction 98 with the neighboring P-region 90 that has a high reverse-bias breakdown voltage and therefore functions as the isolating junction. Each P+ region 94 forms a junction 100 with its neighboring N region 92 that has a low reverse-bias breakdown voltage and therefore functions as the destructible junction. Typically the N region 92 has a dopant concentration of $1 \times 10^{18}$ atoms/cm$^3$, the P− region 90 has $1 \times 10^{17}$ atoms/cm$^3$, the P+ region 94 has $1 \times 10^{19}$ atoms/cm$^3$, and the N+ region 96 has $1 \times 10^{20}$ atoms/cm$^3$. The N region 92 is common to both cells on either side of it, each cell comprising the two back-to-back diodes with different reverse-bias breakdown voltage.

The oversize opening 74 exposes a large area of the first aluminum layer 76 to the destructible junction 100. The lateral distance from the edge of the oversize opening 74 to the point where the junction 100 intercepts the top surface of the polysilicon layer 90 is equal to or greater than the lateral distance of the junction 100 to the edge of the opening 54 in the oxide layer 40.

In FIG. 10, a single step defines both the openings for the P+ region 94 as well as the opening for the aluminum contact to the N region 92. In this way the distance between the aluminum contact and the junction 100 is easily controllable.

FIGS. 15–20 show another embodiment of the invention. As in the previous embodiment of FIGS. 9–14, an abbreviated description is given.

Figure 15:
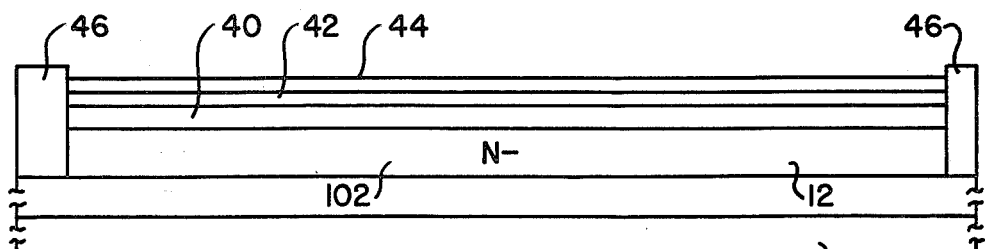
FIGS. 15–20 are cross-sectional views showing various processing steps for fabricating a memory cell constructed according to yet another embodiment of the invention.

In FIG. 15 a layer 102 of intrinsic polysilicon is lightly doped with an N type impurity.

Figure 16:
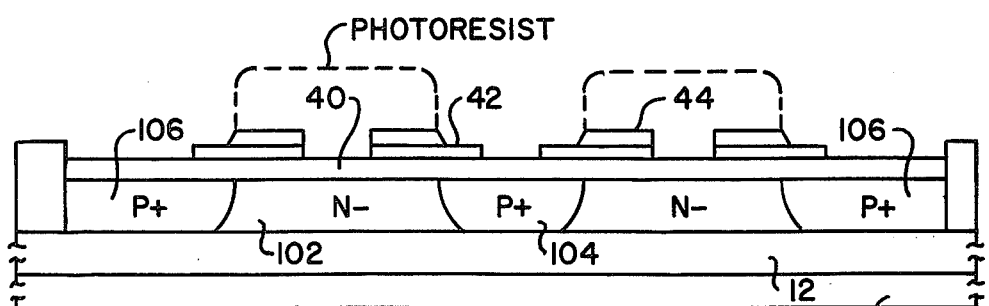

In FIG. 16 openings are made in the silicon nitride layer 42 and silicon dioxide layer 44 to define the polysilicon regions of different dopant concentration. Three highly doped regions of P-type conductivity are formed in the N-layer 102, namely a central P+ region 104 and two outer P+ regions 106.

Figure 17:
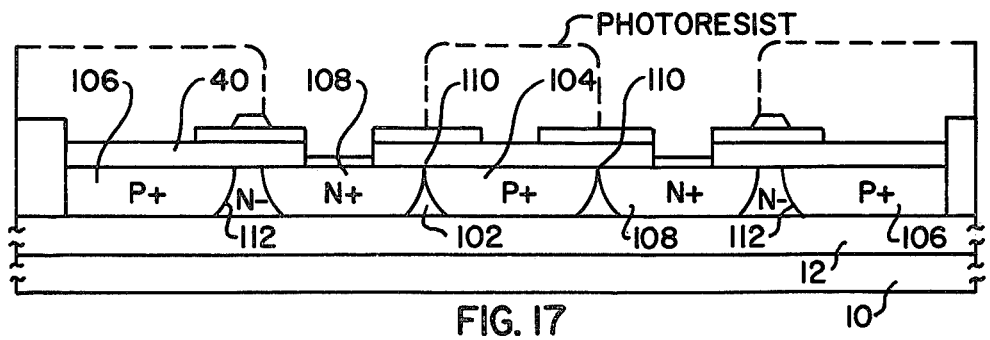

In FIG. 17 two highly doped regions 108 of N-type conductivity are formed in the N-layer 102. Each of the N+ regions 108 is spaced from its neighboring P+ region 106 but overlaps partly the central P+ region 104 to form junctions 110 near the surface of the polysilicon layer 102. The junctions 110 have a low reverse-bias breakdown voltage. Each of the P+ regions 106 forms a junction 112 with the N-region 102 that has a high reverse-bias breakdown voltage.

Figure 18:
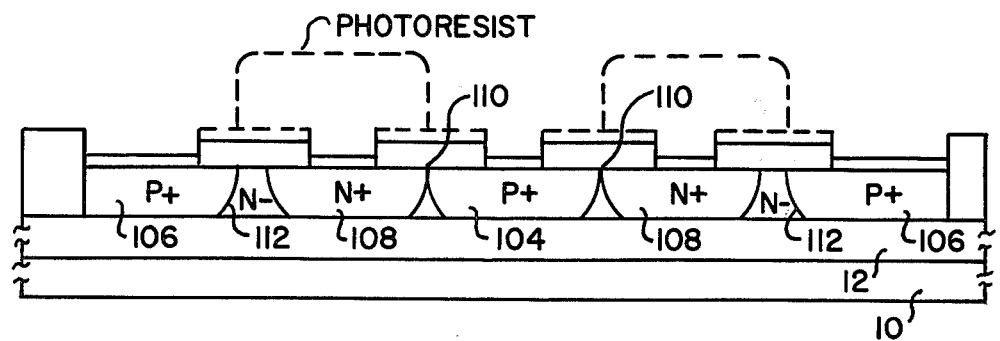

In FIG. 18, openings are formed in the oxide layer 40 to define the contact regions for the regions 104, 106.

Figure 19:
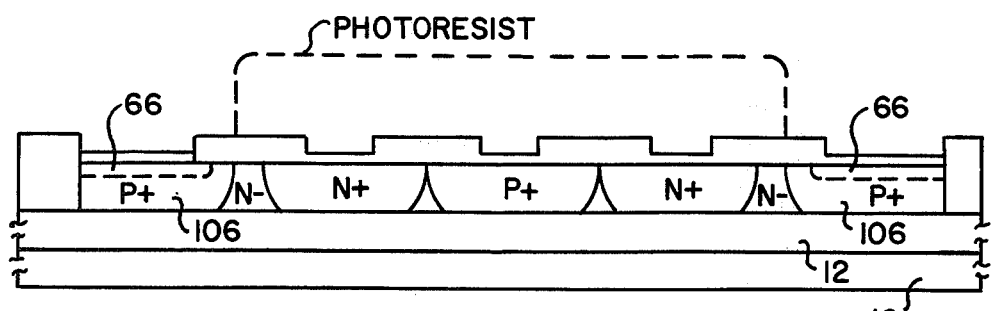

In FIG. 19, the alloy regions 66 are formed in the surface of the outer P+ regions 106.

Figure 20:
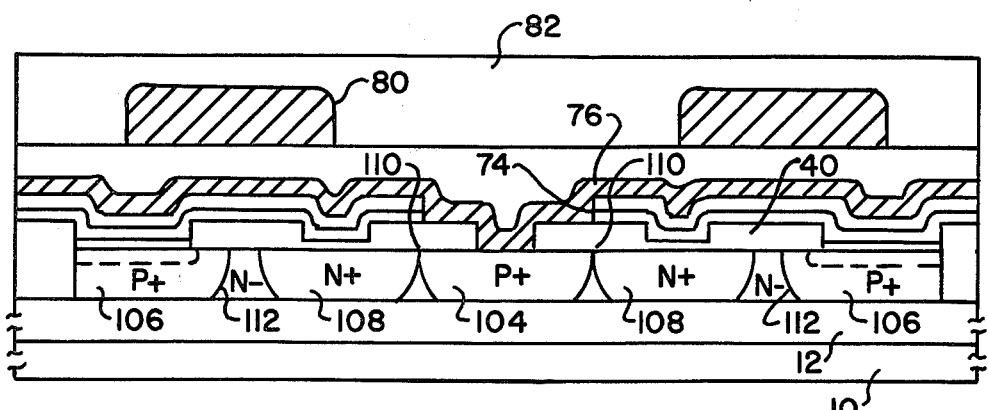

The finished structure is shown in FIG. 20. Here again, a washed emitter type of technique is used to form the aluminum layer 76 contact to the central P+ region 104. Also a single step, shown in FIG. 16, defines all of the regions of different dopant concentration. The single P+ region 104 is common to two programmable memory cells, each cell comprising two back-to-back diodes having junctions 110 and 112 with different reverse-bias breakdown voltage. The junction 110 with the lower reverse-bias breakdown voltage is the destructible junction and the junction 112 with the higher reverse-bias breakdown voltage is the isolating junction.

The oversize opening 74 is located directly above the destructible junction 110, with little or no overlap of the junction 110 by the part of the aluminum layer 76 resting on the oxide layer 40. In this embodiment, it is necessary to minimize the aluminum overlap to avoid encroachment of the aluminum in the N+ regions 108.

Typically, the N-layer 102 has a doping concentration of $10^{18}$ atoms/cm$^3$, the N+ region 108 has a doping cencentration of $10^{20}$ atoms/cm$^3$, and the P+ regions 104, 106 have a doping concentration of $10^{19}$ atoms/cm$^3$.

What is claimed is:

1. A semiconductor memory cell, comprising: (a) a semiconductive body; (b) a layer of insulating material on a surface of said body; (c) a layer of polysilicon on said insulating layer and including a first region of first type conductivity, a second region of first type conductivity spaced laterally from said first region, a third region of second type conductivity between said first and second regions and forming a first semiconductive junction with said first region, said third region differing in impurity concentration from said first region, and a fourth region of second type conductivity between said first and second regions and forming a second semiconductive junction with said second region, said fourth region at least adjoining said third region and differing in impurity concentration from said second region, said first semiconductive junction having a lower reverse bias breakdown voltage than said second semiconductive junction; (d) a first metal contact forming one terminal of said memory cell and contacting said first region on one side of said first semiconductive junction; (e) a second metal contact forming another terminal of said memory cell and contacting said polysilicon layer on the other side of both said first and second semiconductive junctions and conductively coupled to said second region; (f) the surfaces of said third and fourth regions being free of any metal contact; (g) said first semiconductive junction serving as a programming diode when a voltage is applied across said first and second metal contacts with polarity and magnitude to cause reverse-bias breakdown of said first semiconductive junction.

2. The invention according to claim 1, wherein said third and fourth regions are merged within a single common region.

3. The invention according to claim 1, wherein said third and fourth regions comprise regions of different impurity concentration.

4. The invention according to claim 1, wherein said second region comprises the main body of said polysilicon layer, said third and fourth regions constituting a single region formed within said second region, and said first region being formed within said single region.

5. The invention according to claim 1, wherein said fourth region comprises the main body of said polysilicon layer, said first and third regions being formed within said fourth region adjoining each other, said second region being formed within said fourth region spaced laterally from said first and third regions.

6. The invention according to claim 5, wherein said first and third regions form said first semiconductive junction extending the entire depth of said polysilicon layer.

7. The invention according to claim 5, wherein said first and third regions form said first semiconductive junction mainly at the surface of said polysilicon layer only.

8. The invention according to claim 2, and further including a metal contact region of high doping concentration of first type conductivity adjacent said second region and to which said second metal contact is applied.

9. The invention according to claim 8, wherein said second metal contact includes a layer of platinel silicide adherent to said metal contact region and a layer of aluminum deposited on said platinel silicide layer.

10. The invention according to claim 3, wherein said second metal contact is applied to said second region directly.

11. The invention according to claim 10, wherein said second metal contact includes a layer of platinel silicide adherent to said second region and a layer of aluminum deposited on said platinel silicide layer.

12. The invention according to claim 1, wherein said insulating layer is sufficiently thicker than said polysilicon layer as to thermally insulate said polysilicon layer from said semiconductive body.

13. A semiconductive memory cell, comprising: (a) a semiconductive body; (b) a layer of insulating material on a surface of said body; (c) a layer of polysilicon on said insulating layer and including a first region of first type conductivity, a second region of first type conductivity spaced laterally from said first region, a third region of second type conductivity between said first and second regions and forming a first semiconductive junction with said first region, said third region differing in impurity concentration from said first region, and a fourth region of second type conductivity between said first and second regions and forming a second semiconductive junction with said second region, said fourth region at least adjoining said third region and differing in impurity concentration from said second region, said first semiconductive junction having a lower reverse-bias breakdown voltage than said second semiconductive junction; (d) a relatively thin layer of insulating material on said polysilicon layer provided with openings therein through which electrical contacts can be made to said polysilicon layer; (e) a first metal contact forming one terminal of said memory cell extending over the surface of said polysilicon layer at least a distance overlying said first semiconductive junction and extending through one of said openings so as to contact said first region on one side of said first semiconductive junction; (f) a second metal contact forming another terminal of said memory cell and extending through another one of said openings so as to contact said polysilicon layer on the other side of both said first and second semiconductive junctions and conductively coupled to said second region; (g) the surfaces of said third and fourth regions being free of any metal contact; (h) said first semiconductive junction serving as a programming diode when a voltage is applied across said first and second metal conductors with polarity and magnitude to cause reverse-bias breakdown of said first semiconductive junction.

14. The invention according to claim 13, wherein said first metal contact extends over said polysilicon layer a distance beyond said first semiconductive junction.

15. The invention according to claim 13, wherein said first metal contact is made of aluminum.

16. The invention according to claim 13, wherein said first region and said first metal contact are self-aligned through said one opening in the relatively thin insulating layer.

17. The invention according to claim 13 wherein said insulating layer in (b) is sufficiently thicker than said polysilicon layer as to thermally insulate said polysilicon layer from said semiconductive body.

* * * * *